(12) United States Patent
Sharma et al.

(10) Patent No.: US 11,195,932 B2
(45) Date of Patent: Dec. 7, 2021

(54) FERROELECTRIC GATE DIELECTRICS IN INTEGRATED CIRCUITS

(71) Applicant: Intel Corporation, Santa Clara, CA (US)

(72) Inventors: Abhishek A. Sharma, Hillsboro, OR (US); Brian S. Doyle, Portland, OR (US); Prashant Majhi, San Jose, CA (US); Ravi Pillarisetty, Portland, OR (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,824

(22) PCT Filed: Dec. 29, 2017

(86) PCT No.: PCT/US2017/069093
§ 371 (c)(1),
(2) Date: Mar. 25, 2020

(87) PCT Pub. No.: WO2019/132996
PCT Pub. Date: Jul. 4, 2019

(65) Prior Publication Data
US 2020/0235221 A1    Jul. 23, 2020

(51) Int. Cl.
*H01L 29/51* (2006.01)
*H01L 21/8238* (2006.01)
(Continued)

(52) U.S. Cl.
CPC .... *H01L 29/516* (2013.01); *H01L 21/823814* (2013.01); *H01L 21/823828* (2013.01);
(Continued)

(58) Field of Classification Search
CPC ..... H01L 21/823814; H01L 21/823828; H01L 21/823857; H01L 21/823871;
(Continued)

(56) References Cited

U.S. PATENT DOCUMENTS 5,361,224 A    11/1994  Takasu
2004/0046227 A1*  3/2004  Ono ................ H01L 21/823456
                                                257/500

(Continued)

FOREIGN PATENT DOCUMENTS

JP    2006237143    9/2006

OTHER PUBLICATIONS

International Search Report and Written Opinion from PCT/US2017/069093 notified Sep. 28, 2018, 8 pgs.

*Primary Examiner* — Herve-Louis Y Assouman
(74) *Attorney, Agent, or Firm* — Green, Howard & Mughal LLP

(57) ABSTRACT

In various embodiments disclosed herein are systems, methods, and apparatuses for using a ferroelectric material as a gate dielectric in an integrated circuit, for example, as part of a transistor. In an embodiment, the transistor can include a p-type metal oxide semiconductor (PMOS) transistor. In an embodiment, the transistor can have a p-doped substrate. In an embodiment, the channel of the transistor can be a p-doped channel. In an embodiment, the transistor having the ferroelectric material as the gate dielectric can be used in connection with an inverter. In an embodiment, the inverter can be used in connection with an static random access memory (SRAM) memory device.

11 Claims, 7 Drawing Sheets

(51) Int. Cl.
  *H01L 23/535*   (2006.01)
  *H01L 27/092*   (2006.01)
  *H01L 27/11*    (2006.01)
  *H01L 29/66*    (2006.01)

(52) U.S. Cl.
  CPC ............... *H01L 21/823857* (2013.01); *H01L 21/823871* (2013.01); *H01L 23/535* (2013.01); *H01L 27/092* (2013.01); *H01L 27/1104* (2013.01)

(58) Field of Classification Search
  CPC . H01L 23/535; H01L 27/092; H01L 27/1104; H01L 29/516
  See application file for complete search history.

(56) References Cited

U.S. PATENT DOCUMENTS

| | | | |
|---|---|---|---|
| 2006/0038242 A1 | 2/2006 | Hsu et al. | |
| 2006/0148151 A1* | 7/2006 | Murthy | H01L 21/0262 438/197 |
| 2011/0291197 A1* | 12/2011 | Wu | H01L 27/0207 257/368 |
| 2013/0335875 A1* | 12/2013 | Baumann | G11C 11/4125 361/111 |
| 2016/0027490 A1 | 1/2016 | Muller | |
| 2016/0049302 A1* | 2/2016 | Grass | H01L 21/823857 257/369 |
| 2016/0211849 A1 | 7/2016 | Shin et al. | |

\* cited by examiner

FERROELECTRIC GATE DIELECTRICS IN INTEGRATED CIRCUITS

CLAIM OF PRIORITY

This Application is a National Stage Entry of, and claims priority to, PCT Application No. PCT/US2017/069,093, filed on Dec. 29, 2017 and titled "FERROELECTRIC GATE DIELECTRICS IN INTEGRATED CIRCUITS", which is incorporated by reference in its entirety for all purposes.

TECHNICAL FIELD

This disclosure generally relates to integrated circuits, for example, ferroelectric gate dielectrics in integrated circuits.

BACKGROUND

Modern electronics devices, such as non-volatile memories, may make use of various transistors for amplification and switching of electronic signals. Such transistors may need to be scaled down in terms of area, for example, in order to scale down the package in which a transistor and a given electronic device reside.

BRIEF DESCRIPTION OF THE FIGURES

Reference will now be made to the accompanying drawings, which are not necessarily drawn to scale, and wherein.

DETAILED DESCRIPTION

Figure 1:
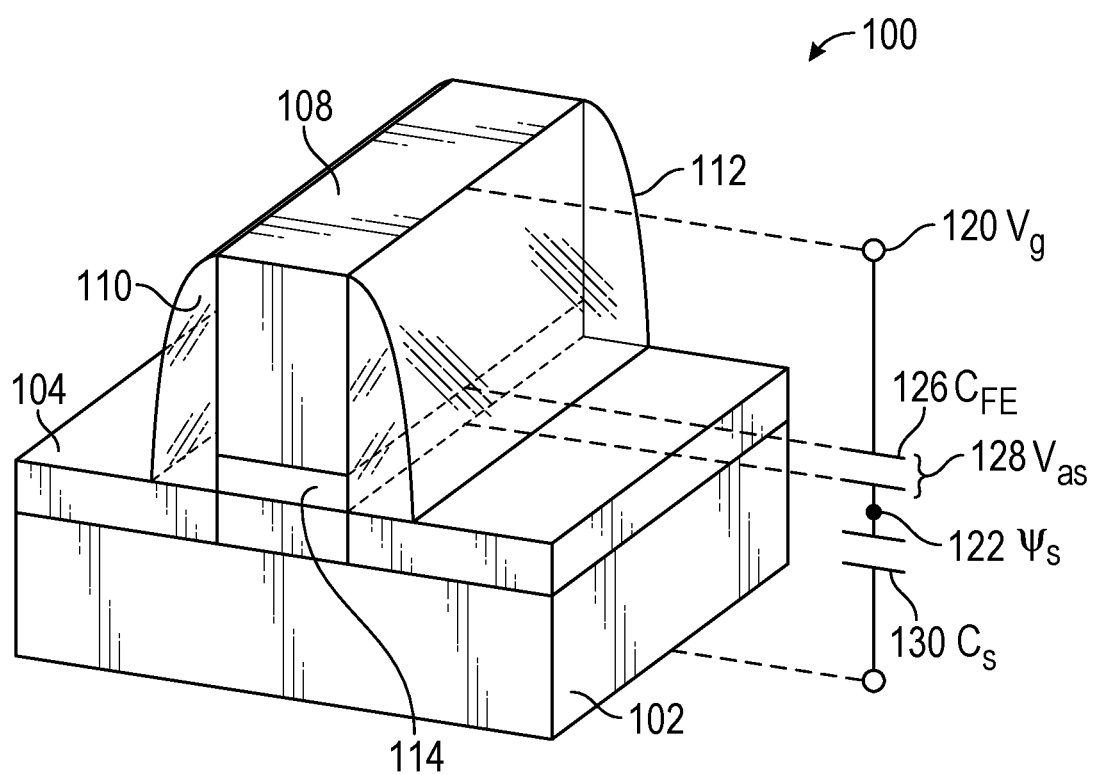
FIG. 1 shows an example diagram of a p-type metal-oxide semiconductor (PMOS) transistor having a ferroelectric gate insulator, in accordance with one or more example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in formation a described structure.

"An embodiment," "various embodiments," and the like indicate embodiment(s) so described may include particular features, structures, or characteristics, but not every embodiment necessarily includes the particular features, structures, or characteristics. Some embodiments may have some, all, or none of the features described for other embodiments. "First," "second," "third," and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

In various embodiments disclosed herein are systems, methods, and apparatuses for using a ferroelectric material as a gate dielectric in a transistor. In an embodiment, the transistor can include a p-type metal oxide semiconductor (PMOS) transistor. In an embodiment, the transistor can have a p-doped substrate. In an embodiment, the channel of the transistor can be a p-doped channel. In an embodiment, the transistor having the ferroelectric material as the gate dielectric can be used in connection with an inverter. In an embodiment, the inverter can be used in connection with an static random-access memory (SRAM) memory device.

In an embodiment, the ferroelectric material can include, but not be limited to, a hafnium zinc oxide, lanthanum oxide, hafnium lanthanum oxide, hafnium oxide, zirconium oxide, hafnium silicon oxide, hafnium aluminum oxide, indium gallium zinc oxide doped with silicon, hafnium, or iron. In an embodiment, the thickness of a gate dielectric using the ferroelectric material can be approximately 0.5 nm to approximately 20 nm, with an example thickness of approximately 5 nm to approximately 10 nm. In an embodiment, the ferroelectric material can be deposited using chemical vapor deposition (CVD), physical vapor deposition (PVD), atomic layer deposition (ALD), plasma-enhanced chemical vapor deposition (PECVD), molecular beam epitaxy (MBE), and the like.

In an embodiment, n-type and p-type materials, for example, n-type and p-type materials used in connection with an n-type MOS (NMOS) and PMOS transistors, can have different electron and hole mobilities. In an embodiment, such a difference in hole and electron mobilities in such materials can lead to transistors having different performance parameters for the similar input voltages and currents. In an embodiment, such performance differences between n-type transistors employing n-type materials and p-type transistors employing p-type material can be accommodated by differentially sizing the dimensions of the p-type and n-type transistors. In an embodiment, the disclosed systems, methods, and apparatuses can lead to improved transistor scaling, as the size of the PMOS transistors having a ferroelectric material can be reduced as compared with PMOS transistors not having a ferroelectric gate dielectric. In an embodiment the latency of devices, such as memory devices, using PMOS transistors having a ferroelectric gate material as the gate dielectric can be increased in comparison to devices using PMOS transistors not having ferroelectric gate dielectrics.

In an embodiment, the current-voltage characteristics of a PMOS transistor having a ferroelectric material as the gate dielectric can have a steeper slope in the voltage bias regime that is lower in magnitude than the voltage at which the transistor turns on, in comparison to the slope of the current-voltage characteristics in the voltage bias regime that is lower in magnitude than the voltage at which the transistor turns on for a PMOS transistor not having a gate dielectric that is ferroelectric. In an embodiment, the current-voltage characteristics of a PMOS transistor having a ferroelectric material as the gate dielectric can have a slope that is less than approximately 60 mV/decade in the voltage bias regime less than the voltage at which the transistor turns on.

In an embodiment, the current-voltage characteristics of a PMOS transistor having a ferroelectric material as the gate dielectric can have a higher driving current at a fixed off-current in comparison to the driving current of the current-voltage characteristics for a PMOS transistor not having a ferroelectric gate dielectric. In another embodiment, the current-voltage characteristics of a PMOS transistor having a ferroelectric material as the gate dielectric can have a lower off-current at a fixed driving-current in comparison to the off-current of the current-voltage characteristics for a PMOS transistor not having a ferroelectric gate dielectric. In an embodiment, the current-voltage characteristics of a PMOS transistor having a ferroelectric material as the gate dielectric can have a lower current leakage in the off-state in comparison to the current leakage exhibited by the current-voltage characteristics for a PMOS transistor not having a ferroelectric gate dielectric.

In an embodiment, the transistors disclosed herein can include a substrate. In one embodiment, the substrate can refer to a solid (usually planar) substance onto which a layer of another substance is applied, and to which that second substance adheres. In another embodiment, the substrate can include a silicon substrate. In one embodiment, the substrate can include a p-doped silicon substrate. In one embodiment, the substrate can be a thin slice of material such as silicon, silicon oxide, silicon dioxide, aluminum oxide, sapphire, an alloy of silicon and germanium, and/or indium phosphide (InP), and the like. In one embodiment, the substrate can include a semiconductor material (e.g., monocrystalline silicon, germanium, silicon germanium, SiGe, and/or a III-V materials based material (e.g., gallium arsenide, GaAs), or any combination thereof).

In an embodiment, the substrate can include a flexible substrate. In various embodiments, substrate can include a polymer based substrate, glass, or any other bendable substrate including 2D materials e.g., graphene and $MoS_2$, organic materials e.g., pentacene, transparent oxides e.g., indium gallium zinc oxide (IGZO), polycrystalline III-V materials, polycrystalline Ge, polycrystalline Si, amorphous III-V materials, amorphous Ge, amorphous Si, or any combination thereof. In an embodiment, the amorphous III-V materials can have a deposition temperature lower than that of the polycrystalline III-V materials. In an embodiment, substrate can be, for example, an organic, a ceramic, a glass, or a semiconductor substrate. In one embodiment, substrate comprises a semiconductor material, e.g., silicon (Si). In one embodiment, substrate is a monocrystalline Si substrate.

In one embodiment, the substrate, for example, a silicon wafer can include a memory array periphery devices, for example, input/output devices. In an embodiment, placing the memory array periphery devices under the substrate can increase the memory array efficiency while reducing the memory array area consumption. In an embodiment, the substrate can include electronic devices, for example, transistors, memories, capacitors, resistors, optoelectronic devices, switches, any other active and passive electronic devices that are separated by electrically insulating layers, for example, interlayer dielectric layers, trench insulation layers, or any other insulating layers known to one of ordinary skill in the art of the electronic device manufacturing. In at least some embodiments, the substrate can include metal interconnects and vias configured to connect the metallization layers. In an embodiment, substrate can be a semiconductor-on-isolator (SOI) substrate including a bulk lower substrate, a middle insulation layer, and a top monocrystalline layer. The top monocrystalline layer may comprise, for example, silicon.

In an embodiment, the transistors disclosed herein can include a source. In another embodiment, the source can include a p-doped semiconductor. In an embodiment, the source can include a p-doped gallium antimonide (GaSb) layer. In one embodiment, the source can include a p-doped aluminum antimonide (AlSb) and/or an indium antimonide (InSb) layer. In another embodiment, the source can include a nonreactive metal. In one embodiment, the source can include tungsten, titanium nitride, aluminum, titanium, tantalum nitride, cobalt, and/or nickel. In another embodiment, the source can include an p-doped indium gallium arsenide layer. In one embodiment, the source can include silicon. In another embodiment, the silicon material may be p-doped. In another embodiment, the source can include doped or undoped black phosphorous, titanium, tantalum, cobalt, molybdenum, titanium nitride, tantalum nitride, hafnium, copper, gadolinium, and the like. In one embodiment, the source can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the source. In one embodiment, source can include gettering materials. In one embodiment, the gettering materials can getter sulfur. In one embodiment, the source can be doped, for example, by creating vacancies of sulfur and selenium. In one embodiment, the source can be doped with oxygen vacancies if the source comprises an oxide or a multi-material system. In another embodiment, the source can be doped with phosphorous, boron, aluminum, tin, hafnium, titanium, copper, indium, and/or arsenic if the source comprises a non-oxide a single-material semiconductor. In another embodiment, the source can be approximately 1 nanometer to approximately 100 nm thick, with example thicknesses of approximately 10 nm to approximately 50 nm thick. In one embodiment, the source can be deposited using PVD, CVD, MOCVD, MBE, and/or ALD, and the like.

In an embodiment, the transistors disclosed herein can include a drain. In another embodiment, the drain can include a nonreactive metal. In one embodiment, the drain can include tungsten, titanium nitride, aluminum, titanium, tantalum nitride, cobalt, and/or nickel. In another embodiment, the drain can include a p-doped indium gallium arsenide layer. In one embodiment, the drain can include silicon. In another embodiment, the silicon material may be p-doped. In another embodiment, the drain can include doped or undoped black phosphorous, titanium, tantalum, cobalt, molybdenum, titanium nitride, tantalum nitride, hafnium, copper, gadolinium, and the like. In one embodiment, the drain can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the drain. In one embodiment, source can include gettering materials. In one embodiment, the gettering materials can getter sulfur. In one embodiment, the drain can be doped, for example, by creating vacancies of sulfur and selenium. In one embodiment, the drain can be doped with oxygen vacancies if the source comprises an oxide or a multi-material system. In another embodiment, the drain can be doped with phosphorous, boron, aluminum, tin, hafnium, titanium, copper, indium, and/or arsenic if the drain comprises a non-oxide a single-material semiconductor. In another embodiment, the drain can be approximately 1 nanometer to approximately 100 nm thick, with example thicknesses of approximately 10 nm to approximately 50 nm thick. In one embodiment, the drain can be deposited using PVD, CVD, MOCVD, MBE, and/or ALD, and the like.

In an embodiment, the transistors disclosed herein can include a gate. In one embodiment, a gate can be deposited on a gate dielectric. In another embodiment, the gate can include a metal. In another embodiment, the gate can include a transition metal. In one embodiment, the gate can be used to tune the threshold voltage of the transistor. In one embodiment, gate can include titanium nitride, cobalt, tungsten and/or platinum. In one embodiment, the gate can be deposited using PVD, CVD, MOCVD, MBE and/or ALD, and the like. In one embodiment, the gate can have a thickness of approximately 30 nm to approximately 100 nm, with an example thickness of approximately 40 nm to approximately 60 nm.

In an embodiment, the transistors disclosed herein can include a gate dielectric. In an embodiment, the ferroelectric material comprising the gate dielectric can be polarized in either a positive or negative direction. In one embodiment, a change in the polarization of the ferroelectric material comprising the gate dielectric can lead to a change in the capacitance of the ferroelectric material. In another embodiment, the change in the capacitance of the ferroelectric material can lead to a change in the gate capacitance of the transistor. In another embodiment, a change in the gate capacitance of the transistor can affect the flow of electrons and holes in the channel of the transistor.

In an embodiment, the transistors disclosed herein can include spacers. In an embodiment, the spacers can serve to provide electrical insulation between the gate and the source and/or the drain. In one embodiment, the spacers can include an insulator, for example, silicon oxide and/or silicon nitride. The spacer can be serve to prevent the source and/or drain from making electrical contact to the gate. In an embodiment, the spacers can be deposited using PVD, CVD, MOCVD, MBE, and/or ALD, and the like.

In an embodiment, an inverter as described herein can include a first transistor that has an NMOS substrate and/or channel and a second transistor that has a PMOS substrate and/or channel. In another embodiment, the first transistor of the inverter can include a source, a gate dielectric, and a gate, and an output node. In an embodiment, the output node can serves as a drain for a first transistor of the inventor. In an embodiment, the gate dielectric in the first transistor having an NMOS substrate and/or channel may not be ferroelectric. In an embodiment, the second transistor of the inverter can have an output node that serves as a source for the second transistor, a gate dielectric that includes a ferroelectric material, a gate, and a drain. In an embodiment, the output node can serve simultaneously as the drain for the first transistor and a source for the second transistor. In an embodiment, the gate of the first transistor and the gate of the second transistor can serve as an input for the inverter, while the output node can serve as the output for the inverter.

FIG. 1 shows an example diagram of a transistor 100 having a ferroelectric gate oxide or gate insulator, in accordance with one or more example embodiments of the disclosure. In an embodiment, the transistor 100 can include a p-type transistor, for example, a PMOS transistor.

In one embodiment, the transistor 100 can include a substrate 102. In one embodiment, the substrate 102 can refer to a solid (usually planar) substance onto which a layer of another substance is applied, and to which that second substance adheres. In another embodiment, the substrate 102 can include a silicon substrate. In one embodiment, the substrate 102 can include a p-doped silicon substrate. In one embodiment, the substrate 102 can be a thin slice of material such as silicon, silicon oxide, silicon dioxide, aluminum oxide, sapphire, an alloy of silicon and germanium, and/or indium phosphide (InP), and the like. In one embodiment, the substrate 102 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 100 can include a source 104. In another embodiment, the source 104 can include a p-doped gallium antimonide (GaSb) layer. In one embodiment, the source 104 can further include a p-doped aluminum antimonide (AlSb) and/or an indium antimonide (InSb) layer. In another embodiment, the source 104 can include a nonreactive metal. In one embodiment, the source 104 can include tungsten, titanium nitride, aluminum, titanium, tantalum nitride, cobalt, and/or nickel. In another embodiment, the source 104 can include a p-doped indium gallium arsenide layer. In one embodiment, the source 104 can include silicon. In another embodiment, the silicon material may be p-doped. In another embodiment, the source 104 can include doped or undoped black phosphorous, titanium, tantalum, cobalt, molybdenum, titanium nitride, tantalum nitride, hafnium, copper, gadolinium, and the like. In one embodiment, the source 104 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the source 104. In one embodiment, source can include gettering materials. In one embodiment, the gettering materials can getter sulfur. In one embodiment, the source 104 can be doped, for example, by creating vacancies of sulfur and selenium. In one embodiment, the source 104 can be doped with oxygen vacancies if the source comprises an oxide or a multi-material system. In another embodiment, the source 104 can be doped with phosphorous, boron, aluminum, tin, hafnium, titanium, copper, indium, and/or arsenic if the source 104 comprises a non-oxide a single-material semiconductor. In another embodiment, the source 104 can be approximately 1 nanometer to approximately 100 nm thick, with example thicknesses of approximately 10 nm to approximately 50 nm thick. In one embodiment, the source 104 can be deposited using PVD, CVD, MOCVD, MBE, and/or ALD, and the like.

In one embodiment, the transistor 100 can include a drain 106. In another embodiment, the drain 106 can include a nonreactive metal. In one embodiment, the drain 106 can include tungsten, titanium nitride, aluminum, titanium, tantalum nitride, cobalt, and/or nickel. In another embodiment, the drain 106 can include an p-doped indium gallium arsenide layer. In one embodiment, the drain 106 can include silicon. In another embodiment, the silicon material may be p-doped. In another embodiment, the drain 106 can include doped or undoped black phosphorous, titanium, tantalum, cobalt, molybdenum, titanium nitride, tantalum nitride, hafnium, copper, gadolinium, and the like. In one embodiment, the drain 106 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the drain 106. In one embodiment, source can include gettering materials. In one embodiment, the gettering materials can getter sulfur. In one embodiment, the drain 106 can be doped, for example, by creating vacancies of sulfur and selenium. In one embodiment, the drain 106 can be doped with oxygen vacancies if the source comprises an oxide or a multi-material system. In another embodiment, the drain 106 can be doped with phosphorous, boron, aluminum, tin, hafnium, titanium, copper, indium, and/or arsenic if the drain 106 comprises a non-oxide a single-material semiconductor. In another embodiment, the drain 106 can be approximately 1 nanometer to approximately 100 nm thick, with example thicknesses of approximately 10 nm to approximately 50 nm thick. In one embodiment, the drain 106 can be deposited using PVD, CVD, MOCVD, MBE, and/or ALD, and the like.

In one embodiment, the transistor 100 can include a gate 108. In one embodiment, a gate 108 can be deposited on a gate dielectric 114, to be discussed further below. In another embodiment, the gate 108 can include a metal. In another embodiment, the gate 108 can include a transition metal. In one embodiment, the gate 108 can be used to tune the threshold voltage of the transistor 100. In one embodiment, gate 108 can include titanium nitride, cobalt, tungsten and/or platinum. In one embodiment, the gate 108 can be deposited using PVD, CVD, MOCVD, MBE and/or ALD, and the like. In one embodiment, the gate 108 can have a thickness of approximately 30 nm to approximately 100 nm, with an example thickness of approximately 40 nm to approximately 60 nm.

In one embodiment, the transistor 100 can include spacers 110 and 112. In an embodiment, the spacers 110 and 112 can serve to provide electrical insulation between the gate 108, the source 104, and/or the drain 106. In one embodiment, the spacers 110 and 112 can include an insulator, for example, silicon oxide or silicon nitride. In an embodiment, the spacer 110 and 112 can be serve to prevent the source 104 and/or drain 106 from making electrical contact to the gate 108.

In one embodiment, the transistor 100 can include a gate dielectric 114. In another embodiment, the gate dielectric 114 can include a ferroelectric material. In an embodiment, the ferroelectric material can include, but not be limited to, a hafnium zinc oxide, lanthanum oxide, hafnium lanthanum oxide, hafnium oxide, zirconium oxide, hafnium silicon oxide, hafnium aluminum oxide, indium gallium zinc oxide doped with silicon, hafnium, or iron. In one embodiment, the gate 108 of the transistor 100 can be biased at a gate voltage ($V_g$) 120. In another embodiment, the gate voltage 120 can be with respect to the voltage of the substrate 102. In one embodiment, the gate material can be deposited using PVD, CVD, PECVD, MOCVD, and/or ALD, and the like. In one embodiment, the gate dielectric 114 can have a thickness of approximately 1 nm to approximately 10 nm, with an example thickness of approximately 2 nm to approximately 4 nm.

In one embodiment, the source 104 of the transistor 100 can have a potential $\Psi_s$ 122. In another embodiment, the voltage $\Psi_s$ 122 of the source 104 can be measured with respect to the voltage level of the substrate 102. In one embodiment, the gate dielectric 114 can have a capacitance $C_{FE}$ 126. In another embodiment, the transistor 100 can have a voltage drop across the gate dielectric of $V_{ox}$ 128. In one embodiment, the transistor 100 can have a capacitance $C_s$ 130 that can represent the capacitance of the substrate 102. In another embodiment, the capacitance $C_s$ 130 can have a value measured between the electrical connection of the source and the substrate 102.

In an embodiment, the ferroelectric material comprising the gate dielectric 114 can be polarized in either a positive or negative direction. In one embodiment, a change in the polarization of the ferroelectric material comprising the gate dielectric 114 can lead to a change in the capacitance of the ferroelectric material. In another embodiment, the change in the capacitance of the ferroelectric material can lead to a change in the gate capacitance of the transistor 100. In another embodiment, a change in the gate capacitance of the transistor 100 can affect the flow of electrons and holes in the channel of the transistor.

In an embodiment, the channel of the transistor can include a region of the transistor between the source 104 and the drain 106. In one embodiment, when the ferroelectric material is biased in the negative capacitance regime but has not yet fully been switched, just as the ferroelectric material is about to switch polarizations, the effective capacitance of the ferroelectric material, as seen by the channel of the transistor 100, can rise with respect to a voltage range that does not place the ferroelectric material in such a negative capacitance regime. In such a voltage bias situation, the sub-threshold swing of the transistor can be improved, which can lead to greater control over the transistor's on and off current-voltage regimes. By increasing the sub-threshold swing of the transistor, for the same gate voltage applied to the transistor, the transistor can output an increased amount of current with respect to transistors not including a ferroelectric gate dielectric. In one embodiment, such an increased or improved sub-threshold swing for the transistor can be observed on a current voltage plot, that is, a drain current versus gate voltage plot, for example, by observing the slope of the transistor in the sub-threshold regime.

Figure 2:
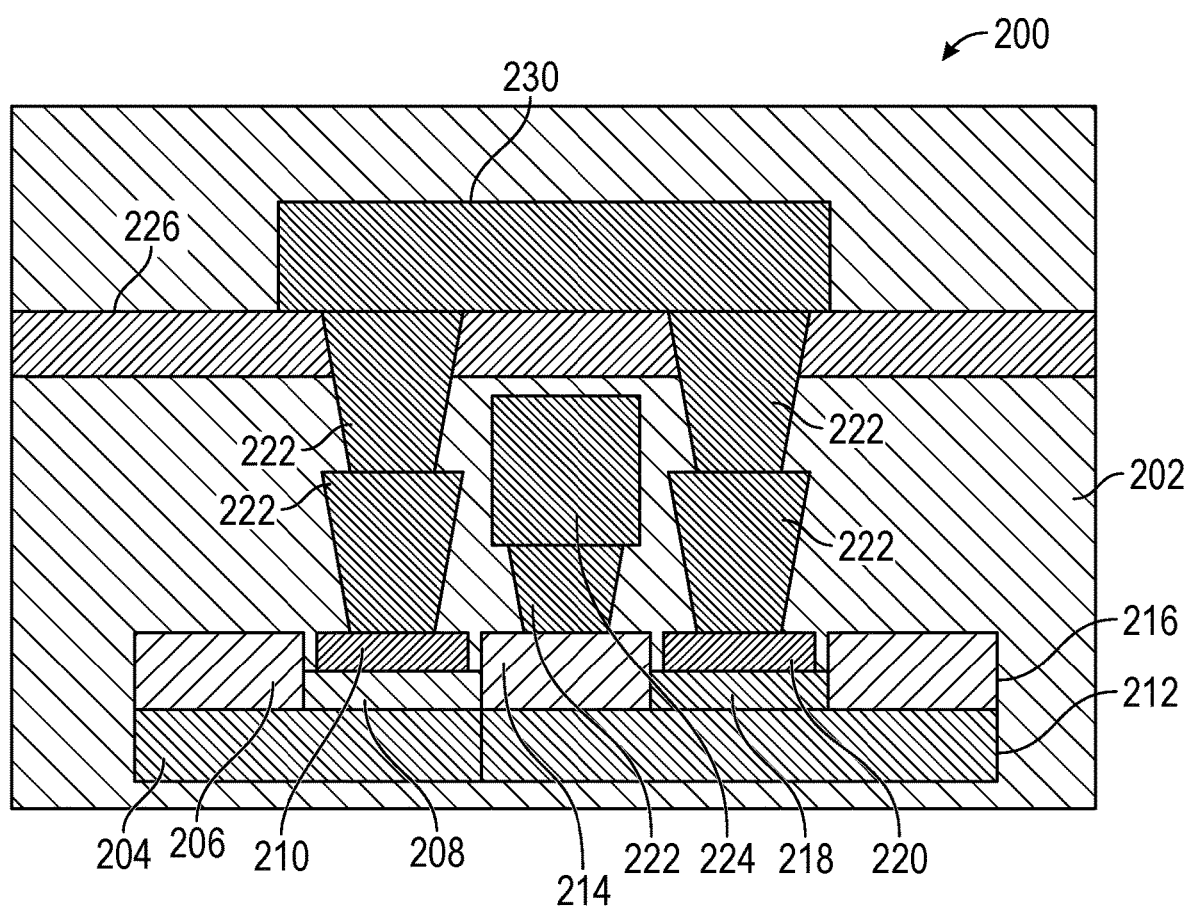
FIG. 2 shows a diagram of an inverter, in accordance with one or more example embodiments of the disclosure.

FIG. 2 shows a diagram of an inverter 200, in accordance with one or more example embodiments of the disclosure. In one embodiment, the inverter 200 can include an insulator 202. In one embodiment, the insulator 202 can include an interlayer dielectric (ILD) material. In another embodiment, the insulator 202 can include an oxide. In an embodiment, the insulator 202 can include a silicon dioxide ($SiO_2$), or a low-K material. In one embodiment, the insulator 202 can be deposited using PVD, CVD, MOCVD, and/or ALD, and the like.

In one embodiment, the inverter 200 can include a substrate 204. In another embodiment, the substrate 204 can include a n-doped substrate for an NMOS portion of the inverter 200. In one embodiment, the substrate 204 can refer to a solid (usually planar) substance onto which a layer of another substance is applied, and to which that second substance adheres. In another embodiment, the substrate 204 can include a silicon substrate. In one embodiment, the substrate 204 can be a thin slice of material such as silicon, silicon oxide, silicon dioxide, aluminum oxide, sapphire, an alloy of silicon and germanium, and/or indium phosphide (InP), and the like. In one embodiment, the substrate 204 can include a semiconductor material (e.g., monocrystalline silicon, germanium, silicon germanium, SiGe, and/or a III-V materials based material (e.g., gallium arsenide, GaAs), or any combination thereof).

In one embodiment, the inverter 200 can include a source 206. In another embodiment, the source 206 can represent a source for an NMOS portion of the inverter 200. In another embodiment, the source 206 can include a doped semiconductor material, for example, an n-doped semiconductor material. the source 206 can include an n-doped indium phosphide layer. In another embodiment, the source 206 can include a nonreactive metal. In one embodiment, the source 206 can include tungsten and/or titanium nitride, aluminum, titanium, tantalum nitride, cobalt, and/or nickel material. In another embodiment, the source 206 can include an n-doped indium gallium arsenide layer. In one embodiment, the source 206 can include silicon. In another embodiment, the silicon material may be n-doped. In another embodiment, the source 206 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating excess electron in the source 206. In one embodiment, source 206 can include gettering materials. In another embodiment, the source 206 can be doped with phosphorous, boron, aluminum, tin, hafnium, titanium, copper, indium, and/or arsenic if the source 206 comprises a non-oxide a single-material semiconductor. In another embodiment, the source 206 can be approximately 1 nanometer to approximately 100 nm thick, with example thicknesses of approximately 10 nm to approximately 50 nm thick. In one embodiment, the source 206 can be deposited using PVD, CVD, MOCVD, MBE, and/or ALD, and the like.

In one embodiment, the inverter 200 can include a gate dielectric 208. In another embodiment, the gate dielectric 208 can represent a gate dielectric for NMOS portion of the inverter 200. In one embodiment, the gate dielectric 208 can include a dielectric material. In another embodiment, the gate dielectric 208 can include silicon oxide. In another embodiment, the gate dielectric 208 can include a high-K dielectric material. In another embodiment, the high-K material, for example, hafnium oxide, tantalum oxide, titanium oxide, aluminum oxide, silicon dioxide, silicon nitride and the like. In one embodiment, an electroglass (EG) can be used as the gate dielectric 208. In one embodiment, the gate dielectric 208 can include hexagonal boron nitride (HBN). In one embodiment, the gate material can be deposited using PVD, CVD, and/or ALD, and the like. In one embodiment, the gate dielectric 208 can have a thickness of approximately 1 nm to approximately 10 nm, with an example thickness of approximately 2 nm to approximately 4 nm.

In one embodiment, the inverter 200 can include a gate 210. In another embodiment, the gate 210 can represent a gate for an NMOS portion of the inverter 200. In another embodiment, the gate 210 can represent an input of the inverter 200. In another embodiment, the gate 210 can represent a wordline for the inverter 200. In one embodiment, the gate 210 can be deposited on a gate dielectric 208, discussed above. In another embodiment, the gate 210 can include a metal. In another embodiment, the gate 210 can include a transition metal. In one embodiment, the gate 210 can be used to tune the threshold voltage of the NMOS transistor portion of the inverter 200. In one embodiment, gate 210 can include titanium nitride, cobalt, tungsten and/or platinum. In one embodiment, the gate 210 can be deposited using PVD, CVD, MOCVD, MBE and/or ALD, and the like. In one embodiment, the gate 210 can have a thickness of approximately 30 nm to approximately 100 nm, with an example thickness of approximately 40 nm to approximately 60 nm.

In one embodiment, the inverter 200 can include a substrate 212. In another embodiment, the substrate 212 can be a p-doped substrate. In another embodiment, the substrate 212 can represent a substrate for a PMOS portion of the inverter 200. In one embodiment, the substrate 212 can refer to a solid (usually planar) substance onto which a layer of another substance is applied, and to which that second substance adheres. In another embodiment, the substrate 212 can include a silicon substrate. In one embodiment, the substrate 212 can be a thin slice of material such as silicon, silicon oxide, silicon dioxide, aluminum oxide, sapphire, an alloy of silicon and germanium, and/or indium phosphide (InP), and the like. In one embodiment, the substrate 212 can include a semiconductor material (e.g., monocrystalline silicon, germanium, silicon germanium, SiGe, and/or a III-V materials based material (e.g., gallium arsenide, GaAs), or any combination thereof).

In one embodiment, the inverter 200 can include an output node 214 of the inverter 200. In another embodiment, the output node 214 of the inverter 200 can represent a drain for the NMOS portion of the inverter 200 and can also represent a source for the PMOS portion of the inverter 200. In an embodiment, the output node 214 can be p-doped.

In another embodiment, the output node 214 can include a nonreactive metal. In one embodiment, the output node 214 can include tungsten, titanium nitride, aluminum, titanium, tantalum nitride, cobalt, and/or nickel. In another embodiment, the output node 214 can include a p-doped indium gallium arsenide layer. In one embodiment, the output node 214 can include silicon. In another embodiment, the silicon material may be p-doped. In another embodiment, the output node 214 can include doped or undoped black phosphorous, titanium, tantalum, cobalt, molybdenum, titanium nitride, tantalum nitride, hafnium, copper, gadolinium, and the like. In one embodiment, the output node 214 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the output node 214. In one embodiment, source can include gettering materials. In one embodiment, the gettering materials can getter sulfur. In one embodiment, the output node 214 can be doped, for example, by creating vacancies of sulfur and selenium. In one embodiment, the output node 214 can be doped with oxygen vacancies if the source comprises an oxide or a multi-material system. In another embodiment, the output node 214 can be doped with phosphorous, boron, aluminum, tin, hafnium, titanium, copper, indium, and/or arsenic if the output node 214 comprises a non-oxide a single-material semiconductor. In another embodiment, the output node 214 can be approximately 1 nanometer to approximately 100 nm thick, with example thicknesses of approximately 10 nm to approximately 50 nm thick. In one embodiment, the output node 214 can be deposited using PVD, CVD, MOCVD, MBE, and/or ALD, and the like.

In one embodiment, the inverter 200 can include a drain 216. In another embodiment, the drain 216 can represent a drain for the PMOS portion of the inverter 200. In another embodiment, the drain 216 can include a p-doped semiconductor. In another embodiment, the drain 216 can include a nonreactive metal. In one embodiment, the drain 216 can include tungsten, titanium nitride, aluminum, titanium, tantalum nitride, cobalt, and/or nickel. In another embodiment, the drain 216 can include an p-doped indium gallium arsenide layer. In one embodiment, the drain 216 can include silicon. In another embodiment, the silicon material may be p-doped. In another embodiment, the drain 216 can include doped or undoped black phosphorous, titanium, tantalum, cobalt, molybdenum, titanium nitride, tantalum nitride, hafnium, copper, gadolinium, and the like. In one embodiment, the drain 216 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the drain 216. In one embodiment, source can include gettering materials. In one embodiment, the gettering materials can getter sulfur. In one embodiment, the drain 216 can be doped, for example, by creating vacancies of sulfur and selenium. In one embodiment, the drain 216 can be doped with oxygen vacancies if the source comprises an oxide or a multi-material system. In another embodiment, the drain 216 can be doped with phosphorous, boron, aluminum, tin, hafnium, titanium, copper, indium, and/or arsenic if the drain 216 comprises a non-oxide a single-material semiconductor. In another embodiment, the drain 216 can be approximately 1 nanometer to approximately 100 nm thick, with example thicknesses of approximately 10 nm to approximately 50 nm thick. In one embodiment, the drain 216 can be deposited using PVD, CVD, MOCVD, MBE, and/or ALD, and the like.

In one embodiment, the inverter 200 can include a gate dielectric 218. In another embodiment, the gate dielectric 218 can represent a gate dielectric for a PMOS portion of the inverter 200. In one embodiment, the gate dielectric 218 can include a ferroelectric material. In an embodiment, the ferroelectric material comprising the gate dielectric 218 can be polarized in either a positive or negative direction. In one embodiment, a change in the polarization of the ferroelectric material comprising the gate dielectric 218 can lead to a change in the capacitance of the ferroelectric material. In another embodiment, the change in the capacitance of the ferroelectric material can lead to a change in the gate capacitance of the PMOS transistor portion of the inverter 200. In another embodiment, a change in the gate capacitance of the gate 220 of the PMOS transistor portion of the inverter 200 can affect the flow of electrons and holes in the channel of the PMOS portion of the inverter 200.

In one embodiment, the inverter 200 can include a gate 220. In another embodiment, the gate 220 can represent a gate for a PMOS portion of the inverter 200. In one embodiment, the gate 220 can represent an input of the inverter 200. In another embodiment, the gate 220 can represent a wordline for inverter 200. In one embodiment, the gate 220 can be deposited on the gate dielectric 218. In another embodiment, the gate 220 can include a metal. In another embodiment, the gate 220 can include a transition metal. In one embodiment, the gate 220 can be used to tune the threshold voltage of the device. In one embodiment, gate 220 can include titanium nitride, cobalt, tungsten and/or platinum. In one embodiment, the gate 220 can be deposited using PVD, CVD, MOCVD, MBE and/or ALD, and the like. In one embodiment, the gate 220 can have a thickness of approximately 10 nm to approximately 100 nm, with an example thickness of approximately 40 nm to approximately 60 nm.

In one embodiment, the inverter 200 can include contacts 222. In another embodiment, the contacts 222 can represent contacts for the input to the inverter 200. In another embodiment, a portion of the contacts 222 can electrically contact the NMOS gate 210 and the PMOS gate 220. In another embodiment, the contacts 222 can be electrically contacted to the output node 214 of the inverter 200 which is positioned at the PMOS portion of the inverter 200. In one embodiment, the inverter 200 can include an output contact 224. In another embodiment, the inverter 200 can include an input contact 230.

In various embodiments, the various contacts 222, 224, and/or 230 can comprise a metallic, semi-metallic, or intermetallic material. In various embodiments, the contacts 222, 224, and/or 230 can comprise a metallic material. Non-limiting examples include gold, copper, silver, aluminum, zinc, tin, platinum, and any of the like. Metallic materials may also be any alloys of such materials. In various embodiments, the contacts 222, 224, and/or 230 can comprise a semi-metallic material. Non-limiting examples include arsenic, antimony, bismuth, a-tin (gray tin) and graphite, and mercury telluride (HgTe). Semi-metallic materials may also be any mixtures of such materials. In various embodiments, the contacts 222, 224, and/or 230 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials. In an embodiment, the contacts 222, 224, and/or 230 may be deposited by any suitable mechanism including, but not limited to, metal foil lamination, physical vapor deposition, chemical vapor deposition, sputtering, metal paste deposition, combinations thereof, or the like.

In one embodiment, the inverter 200 can include an etch stop 226. In an embodiment, the etch stop 226 can be used to seal the underlying materials. The etch stop 226 may further prevent the interdiffusion of metal (for example, metal from the one or more contacts 222, 224, and/or 230) and/or any other materials in proximate layers or in preceding steps or following steps in the processing sequence of the inverter 200. In various embodiments the etch stop 226 can include a silicon nitride (SiN) material. In one embodiment, etch stop 226 can comprise one or more insulating layers. In one embodiment, etch stop 226 comprises one or more nitride layers, for example, a silicon nitride, a silicon oxide nitride, other nitride layer, or any combination thereof. In another embodiment, the etch stop 226 comprises one or more oxide layers, for example, a silicon oxide layer, an aluminum oxide, a carbon doped silicon oxide, other etch stop layer, or any combination thereof. In one embodiment, the thickness of etch stop layer 226 is from about 2 nm to about 20 nm. Generally, the material of the underlying etch stop, e.g., etch stop 226 has etch characteristics that are different from the etch characteristics of the material of the insulating layer to be etched. In an embodiment, the etch stop is placed underneath the etched insulating layer to stop an etching process. Generally, the etching rate of the etched insulating layer is substantially higher than the etching rate of the etch stop layer, such as etch stop 226 at identical etching conditions.

Figure 3:
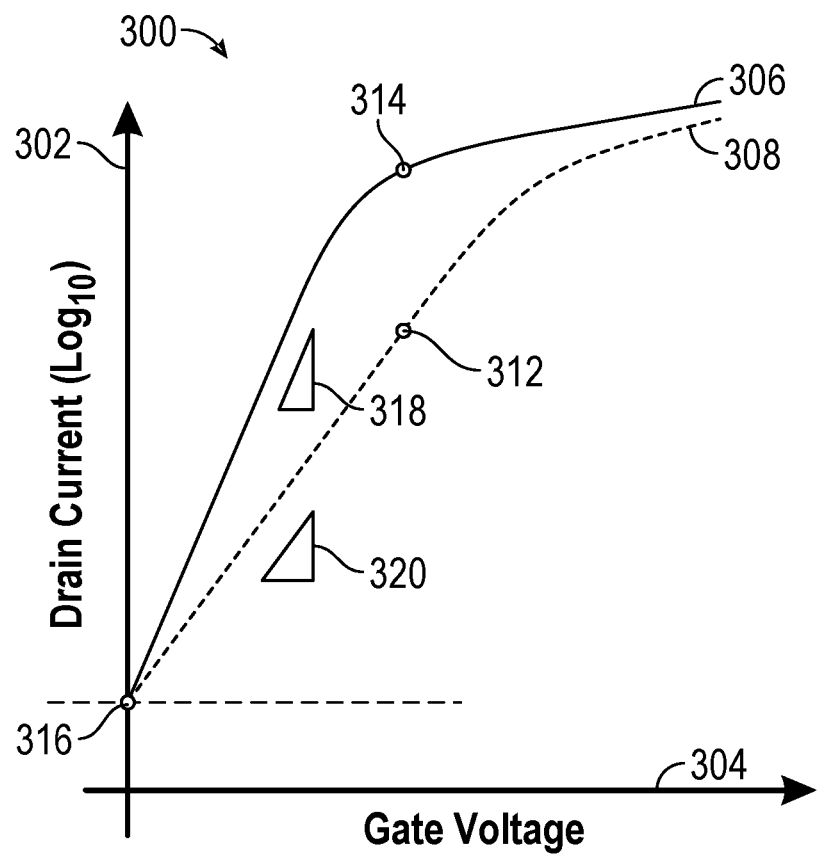
FIG. 3 shows an example plot for the current-voltage characteristics of a PMOS transistor, in accordance with one or more example embodiments of the disclosure.

FIG. 3 shows an example plot 300 for the current voltage characteristics of a PMOS transistor, in accordance with one or more example embodiments of the disclosure. In an embodiment, the PMOS transistor having the plot 300 of the current voltage characteristics can have a ferroelectric gate dielectric. In one embodiment, the plot 300 shows a plot of the drain current 302 versus the gate voltage 304 for the PMOS transistor. In an embodiment, the drain current 302 on the y-axis of the plot 300 can have a log base 10 scale. In one embodiment, an example curve 306 can represent the PMOS transistor having a ferroelectric gate dielectric and the curve 308 can represent a transistor having a conventional gate dielectric, that is, a gate dielectric that is not ferroelectric in nature. In one embodiment, the PMOS transistor having the gate dielectric, that is ferroelectric, can have a steeper slope in the curve 308 as represented by the symbol 318 as compared with the transistor having a conventional gate dielectric represented by gate 308 having a smaller slope in the sub-threshold regime as represented by the symbol 320.

In an embodiment, the transistor having a conventional gate dielectric as represented by curve 308, can have a slope of drain current versus gate voltage of greater than or equal to 60 millivolts per decade which can be the physical limit for PMOS-based transistors using conventional gate dielectrics. On the other hand, for PMOS transistors having a ferroelectric gate dielectric as represented by curve 306, a steeper slope can be observed in the sub-threshold regime of the curve 306 and can have a tenfold rise of drain current versus 60 millivolts of gate voltage, that is, it can have less than a 60 milliwatts per decade slope.

In one embodiment, the on-current for the transistor having a conventional gate dielectric as represented by curve 308, can have a turn on voltage and turn-on current as represented by plot point 312 which can rise dramatically for the transistor having the ferroelectric gate dielectric as represented by curve 306 and plot point 314, that is, plot point 314 represents the gate voltage at which the transistor turns on in the PMOS transistor having the ferroelectric gate dielectric. Accordingly, for the transistors having the ferroelectric gate dielectric, a higher drive current, that is, a higher drain current can be obtained at a fixed off current 316. As such, the transistors can have a higher drivability by employing a gate dielectric having a ferroelectric material.

Figure 4:
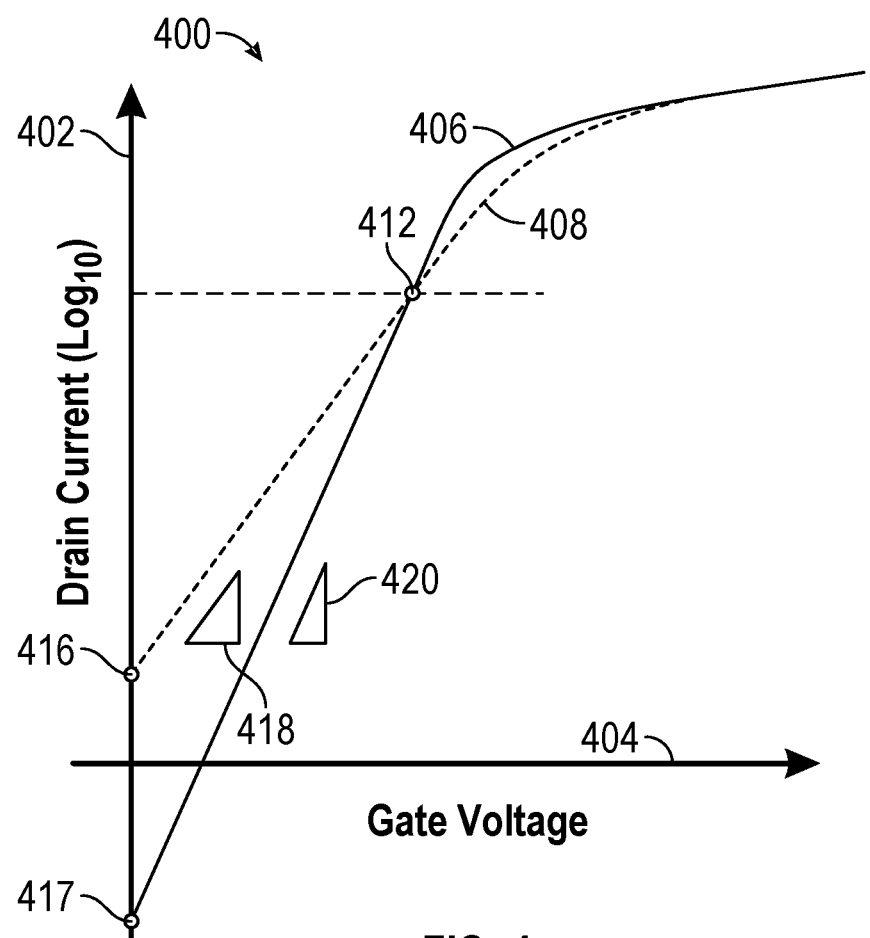
FIG. 4 shows a plot of a drain current versus a gate voltage of an example transistor, in accordance with one or more example embodiments of the disclosure.

FIG. 4 shows a plot of a drain current versus the gate voltage of transistors, in accordance with one or more example embodiments of the disclosure. In one embodiment, the plot 400 can include a drain current 402 versus the gate voltage 404 of transistors having both a gate dielectric that is ferroelectric and a gate dielectric that is not ferroelectric. In one embodiment, curve 406 can represent a curve of the current voltage characteristics of a transistor having a ferroelectric gate dielectric. In another embodiment, the plot 400 can include a curve 408 of a transistor having a gate dielectric that is not ferroelectric. In one embodiment, the curve 406 representing the transistor having a ferroelectric gate dielectric can have a steeper slope as represented by symbol 420 as compared with the curve 408 that represents a transistor not having a ferroelectric gate dielectric as represented by the symbol 418 for the slope of the transistor in the sub-threshold regime.

In one embodiment, biasing the transistor accordingly at a fixed drive current, the on current and on voltage, as represented by plot point 412, can be the same for both types of transistors while the off current can be reduced for the transistor having the ferroelectric gate dielectric. In an embodiment, this can be observed from a comparison of the off-current 416 for the transistor having a non-ferroelectric gate dielectric to the off-current 417 for the transistor having a ferroelectric gate dielectric. In an embodiment, the off-current 416 for the conventional transistor can be positive as shown on the plot 400 of the drain current having a log base-10 Y-axis 402. In an embodiment, the off-current 417 for the transistor having a ferroelectric gate can be negative as shown on the plot 400 of the drain current having a log base-10 Y-axis 402. In such a biasing regime, a transistor having a gate dielectric that is ferroelectric, can have a low current leakage in the off-state, as compared with a transistor having a non-ferroelectric gate dielectric.

Figure 5:
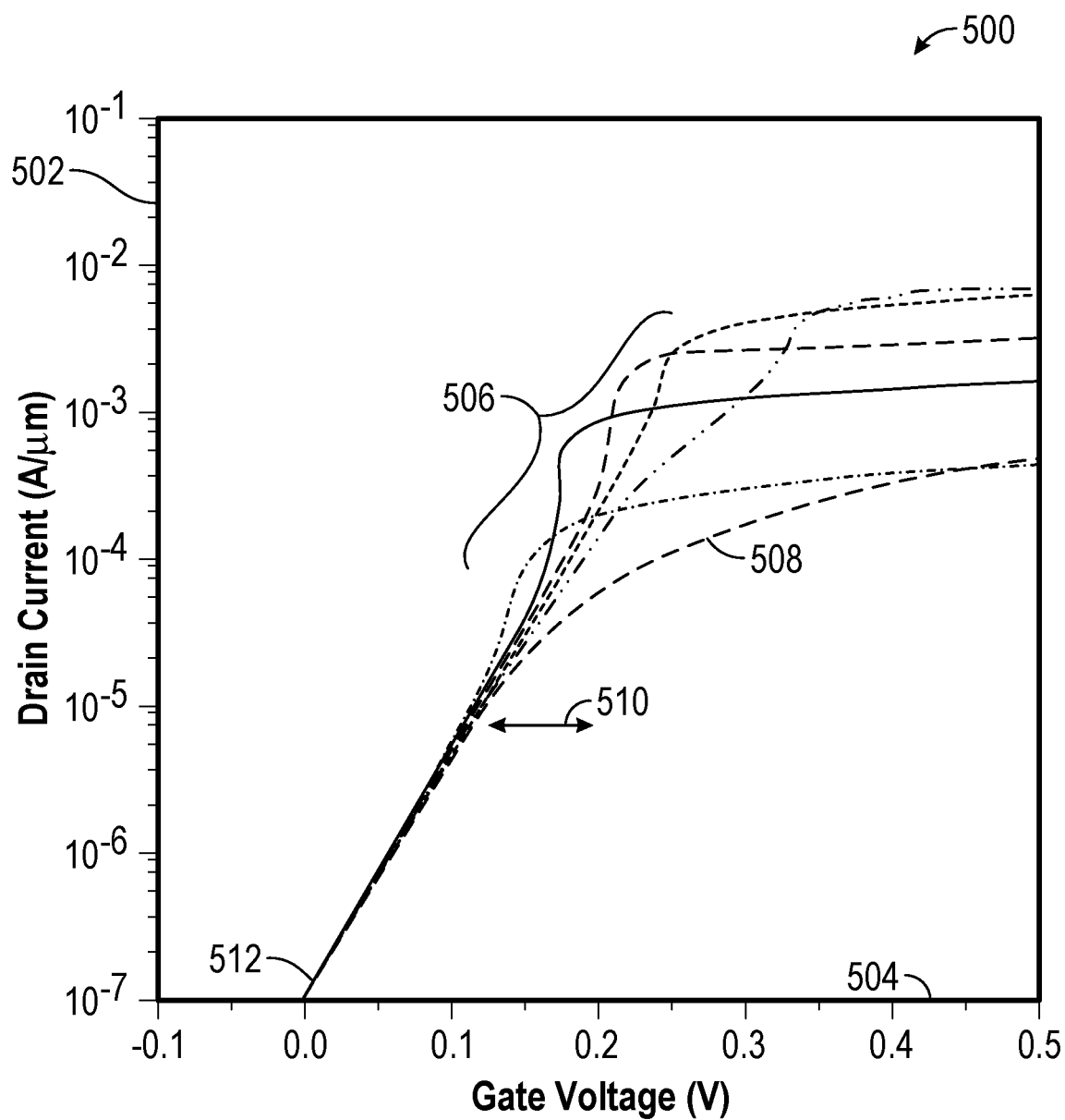
FIG. 5 shows a plot of example data for transistors having a ferroelectric gate, in accordance with one or more example embodiments of the disclosure.

FIG. 5 shows a plot 500 of example data for transistors having a ferroelectric gate, in accordance with one or more example embodiments of the disclosure. In one embodiment, the plot 500 includes a plot of drain current 502 in units of amperes per micrometer on the Y-axis versus gate voltage 504 in units of volts on the X-axis. In one embodiment, the plot 500 includes experimental data for four different devices represented by the group of curves 506 as compared with a plot 508 of a conventional MOSFET transistor having a non-ferroelectric gate dielectric. In one embodiment, the variation seen in the group of curves 506 for the transistors having the ferroelectric gate dielectric can represent different devices having different material parameters such as different thicknesses of the materials and/or device having materials deposited different deposition techniques. In one embodiment, the plot 500 shows a region 510 that represents a difference in the gate voltage required to turn on the transistors. In one embodiment, the plot 500 shows a similar gate voltage 512 for the devices in the off state. In another embodiment, the gate voltage 512 shows a relatively low drain current on the order or approximately $10^{-7}$ amperes per micrometer. In one embodiment, the plot 500 represent a high on current versus off current at low supply voltages of approximately 0.15 volts to approximately 0.2 volts.

Figure 6:
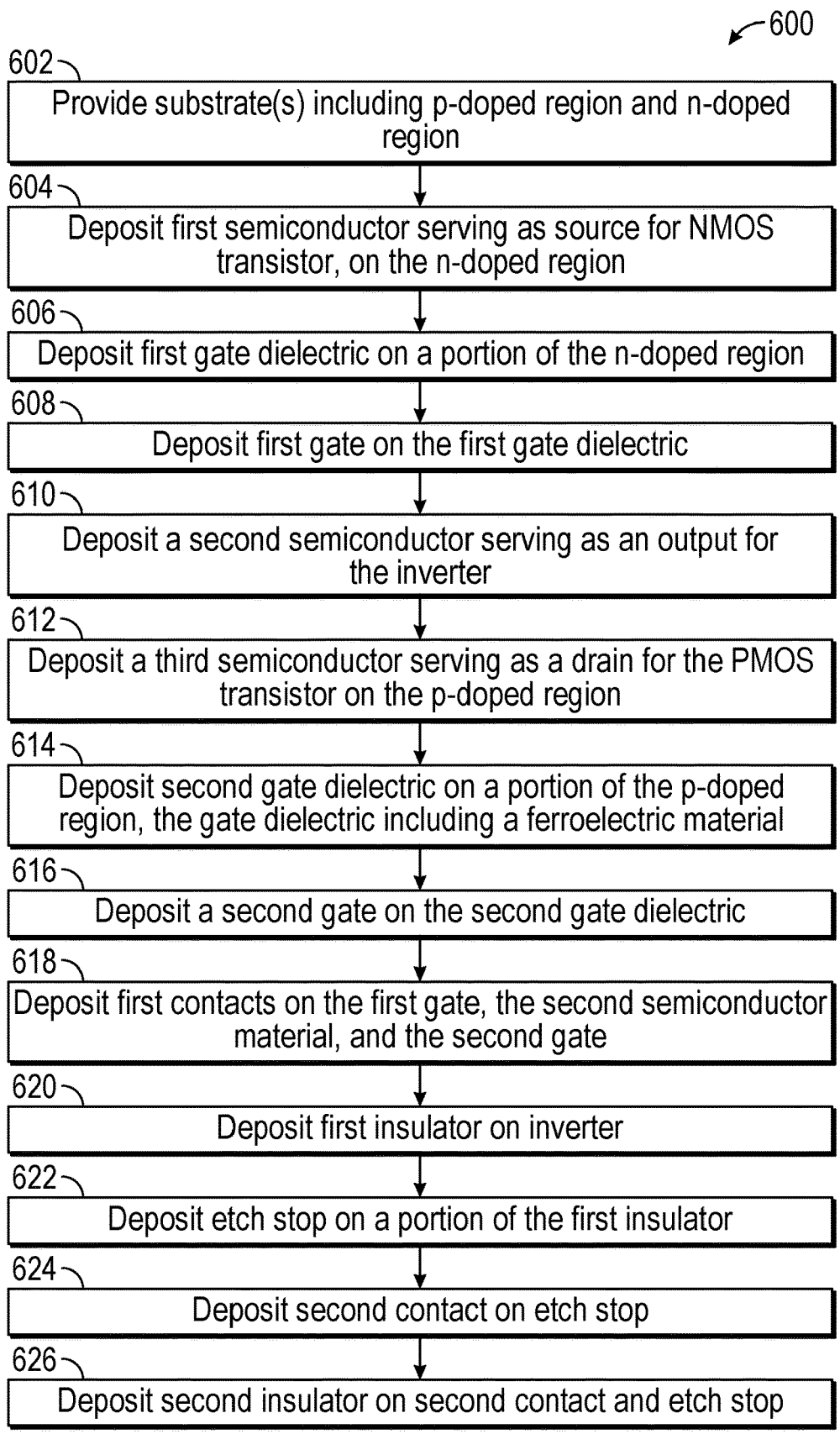
FIG. 6 shows a diagram that represents an example flow for the fabrication of an inverter having PMOS transistors including a ferroelectric gate dielectric, in accordance with one or more example embodiments of the disclosure.

FIG. 6 shows a diagram 600 that represents an example flow for the fabrication of an inverter having transistors including a ferroelectric gate dielectric in a PMOS portion of one of the transistors, in accordance with one or more example embodiments of the disclosure. At block 602, substrates can be provided, the substrates including a p-doped region and an n-doped region. In one embodiment, the substrates can refer to a solid (usually planar) substances onto which a layer of another substance is applied, and to which that second substance adheres. In another embodiment, the substrates can include a silicon substrate. In one embodiment, the substrates can include a p-doped silicon substrate. In another embodiment, the substrates can include an n-doped silicon substrate. In one embodiment, the substrate can be a thin slice of material such as silicon, silicon oxide, silicon dioxide, aluminum oxide, sapphire, an alloy of silicon and germanium, and/or indium phosphide (InP), and the like. In one embodiment, the substrate can include a semiconductor material (e.g., monocrystalline silicon, germanium, silicon germanium, SiGe, and/or a III-V materials based material (e.g., gallium arsenide, GaAs), or any combination thereof).

At block 604, a first semiconductor can be deposited on the n-doped region of the substrate, the first semiconductor serving as a source for an NMOS transistor. In another embodiment, the source can include a doped semiconductor material, for example, an n-doped semiconductor material. In an embodiment, the source can include an n-doped indium phosphide layer. In another embodiment, the source can include a nonreactive metal. In one embodiment, the source can include tungsten and/or titanium nitride, aluminum, titanium, tantalum nitride, cobalt, and/or nickel material. In another embodiment, the source can include an n-doped indium gallium arsenide layer. In one embodiment, the source can include silicon. In another embodiment, the silicon material may be n-doped. In another embodiment, the source can include doped or undoped black phosphorous, titanium, tantalum, cobalt, molybdenum, titanium nitride, tantalum nitride, hafnium, copper, gadolinium, and the like. In one embodiment, the source can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating excess electron in the source. In another embodiment, the source can be doped with phosphorous, boron, aluminum, tin, hafnium, titanium, copper, indium, and/or arsenic if the source comprises a non-oxide a single-material semiconductor. In another embodiment, the source can be approximately 1 nm to approximately 100 nm thick, with example thicknesses of approximately 10 nm to approximately 50 nm thick. In one embodiment, the source can be deposited using PVD, CVD, MOCVD, MBE, and/or ALD, and the like.

At block 606, a first gate dielectric can be deposited on a portion of the n-doped region. In one embodiment, the gate dielectric can include a dielectric material. In another embodiment, the gate dielectric can include silicon oxide. In another embodiment, the gate dielectric can include a high-K dielectric material. In another embodiment, the high-K material, for example, hafnium oxide, tantalum oxide, titanium oxide, aluminum oxide, silicon dioxide, silicon nitride and the like. In one embodiment, an electroglass (EG) can be used as the gate dielectric. In one embodiment, the gate dielectric can include hexagonal boron nitride (HBN). In one embodiment, the gate material can be deposited using PVD, CVD, and/or ALD, and the like. In one embodiment, the gate dielectric can have a thickness of approximately 1 nm to approximately 10 nm, with an example thickness of approximately 2 nm to approximately 4 nm.

At block 608, a first gate can be deposited on the first gate dielectric. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, MBE and/or ALD, and the like. In one embodiment, the gate can have a thickness of approximately 30 nm to approximately 100 nm, with an example thickness of approximately 40 nm to approximately 60 nm.

At block 610, a second semiconductor serving as an output for the inverter can be deposited. In an embodiment, the second semiconductor can include a p-doped semiconductor. In another embodiment, the second semiconductor can include a nonreactive metal. In one embodiment, the second semiconductor can include tungsten, titanium nitride, aluminum, titanium, tantalum nitride, cobalt, and/or nickel. In another embodiment, the second semiconductor can include an p-doped indium gallium arsenide layer. In one embodiment, the second semiconductor can include silicon. In another embodiment, the silicon material may be p-doped. In another embodiment, the second semiconductor can include doped or undoped black phosphorous, titanium, tantalum, cobalt, molybdenum, titanium nitride, tantalum nitride, hafnium, copper, gadolinium, and the like. In one embodiment, the second semiconductor can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the second semiconductor. In one embodiment, source can include gettering materials. In one embodiment, the gettering materials can getter sulfur. In one embodiment, the second semiconductor can be doped, for example, by creating vacancies of sulfur and selenium. In one embodiment, the second semiconductor can be doped with oxygen vacancies if the source comprises an oxide or a multi-material system. In another embodiment, the source can be doped with phosphorous, boron, aluminum, tin, hafnium, titanium, copper, indium, and/or arsenic if the second semiconductor comprises a non-oxide a single-material semiconductor. In another embodiment, the second semiconductor can be approximately 1 nm to approximately 100 nm thick, with example thicknesses of approximately 10 nm to approximately 50 nm thick. In one embodiment, the second semiconductor can be deposited using PVD, CVD, MOCVD, MBE, and/or ALD, and the like.

At block 612, a third semiconductor serving as a drain for the PMOS transistor portion of the inverter can be deposited on the p-doped region. In another embodiment, the drain can include a nonreactive metal. In one embodiment, the drain can include tungsten, titanium nitride, aluminum, titanium, tantalum nitride, cobalt, and/or nickel. In another embodiment, the drain can include an p-doped indium gallium arsenide layer. In one embodiment, the drain can include silicon. In another embodiment, the silicon material may be p-doped. In another embodiment, the drain can include doped or undoped black phosphorous, titanium, tantalum, cobalt, molybdenum, titanium nitride, tantalum nitride, hafnium, copper, gadolinium, and the like. In one embodiment, the drain can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the doping can include generating electron vacancies in the drain. In one embodiment, the drain can include gettering materials. In one embodiment, the gettering materials can getter sulfur. In one embodiment, the drain can be doped, for example, by creating vacancies of sulfur and selenium. In one embodiment, the drain can be doped with oxygen vacancies if the drain comprises an oxide or a multi-material system. In another embodiment, the drain can be doped with phosphorous, boron, aluminum, tin, hafnium, titanium, copper, indium, and/or arsenic if the drain comprises a non-oxide a single-material semiconductor. In another embodiment, the drain can be approximately 1 nm to approximately 100 nm thick, with example thicknesses of approximately 10 nm to approximately 50 nm thick. In one embodiment, the drain can be deposited using PVD, CVD, MOCVD, MBE, and/or ALD, and the like.

At block 614, a second gate dielectric can be deposited on a portion of the p-doped region, the second gate dielectric including a ferroelectric material. In an embodiment, the ferroelectric material comprising the gate dielectric can be polarized in either a positive or negative direction. In one embodiment, a change in the polarization of the ferroelectric material comprising the gate dielectric can lead to a change in the capacitance of the ferroelectric material. In another embodiment, the change in the capacitance of the ferroelectric material can lead to a change in the gate capacitance of the transistor portion of the PMOS region of the inverter. In another embodiment, a change in the gate capacitance of the transistor can affect the flow of electrons and holes in a channel associated with the transistor portion of the PMOS region of the inverter. In another embodiment, the gate dielectric can be approximately 1 nm to approximately 100 nm thick, with example thicknesses of approximately 10 nm to approximately 50 nm thick. In one embodiment, the gate dielectric can be deposited using PVD, CVD, MOCVD, MBE, and/or ALD, and the like.

At block 616, a second gate can be deposited on the second gate dielectric. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, MBE and/or ALD, and the like. In one embodiment, the gate can have a thickness of approximately 30 nm to approximately 100 nm, with an example thickness of approximately 40 nm to approximately 60 nm.

At block 618, first contacts can be deposited on the first gate, the second semiconductor material and the second gate. In an embodiment, the contacts can comprise a metallic, semi-metallic, or intermetallic material. In various embodiments, the contacts can comprise a metallic material. Non-limiting examples include gold, copper, silver, aluminum, zinc, tin, platinum, and any of the like. Metallic materials may also be any alloys of such materials. In various embodiments, the contacts can comprise a semi-metallic material. Non-limiting examples include arsenic, antimony, bismuth, a-tin (gray tin) and graphite, and mercury telluride (HgTe). Semi-metallic materials may also be any mixtures of such materials. In various embodiments, the contacts can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials. In an embodiment, the contacts may be deposited by any suitable mechanism including, but not limited to, CVD, PECVD, PVD, ALD, MBE, metal foil lamination, sputtering, metal paste deposition, combinations thereof, or the like.

At block 620, a first insulator can be deposited on the inverter. In one embodiment, the insulator can include an interlayer dielectric (ILD) material. In another embodiment, the insulator can include an oxide. In an embodiment, the insulator can include a silicon dioxide ($SiO_2$), or a low-K material. In one embodiment, the insulator can be deposited using PVD, CVD, MOCVD, and/or ALD, and the like.

At block 622, an etch stop can be deposited on a portion of the first insulator. In an embodiment, the etch stop can be used to seal the underlying materials. The etch stop may further prevent the interdiffusion of metal (for example, metal from the one or more contacts) and/or any other materials in proximate layers or in preceding steps or following steps in the processing flow for the fabrication of the inverter. In various embodiments the etch stop layer can include a nitride, for example, a silicon nitride (SiN) material.

At block 624, a second contact can be deposited on the etch stop. In an embodiment, the contacts can comprise a metallic, semi-metallic, or intermetallic material. In various embodiments, the contacts can comprise a metallic material. Non-limiting examples include gold, copper, silver, aluminum, zinc, tin, platinum, and any of the like. Metallic materials may also be any alloys of such materials. In various embodiments, the contacts can comprise a semi-metallic material. Non-limiting examples include arsenic, antimony, bismuth, a-tin (gray tin) and graphite, and mercury telluride (HgTe). Semi-metallic materials may also be any mixtures of such materials. In various embodiments, the contacts can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials. In an embodiment, the contacts may be deposited by any suitable mechanism including, but not limited to, CVD, PECVD, PVD, ALD, MBE, metal foil lamination, sputtering, metal paste deposition, combinations thereof, or the like.

At block 626, a second insulator can be deposited on the second contact in the etch stop. In one embodiment, the insulator can include an interlayer dielectric (ILD) material. In another embodiment, the insulator can include an oxide. In an embodiment, the insulator can include a silicon dioxide ($SiO_2$), or a low-K material. In one embodiment, the insulator can be deposited using PVD, CVD, MOCVD, and/or ALD, and the like.

Figure 7:
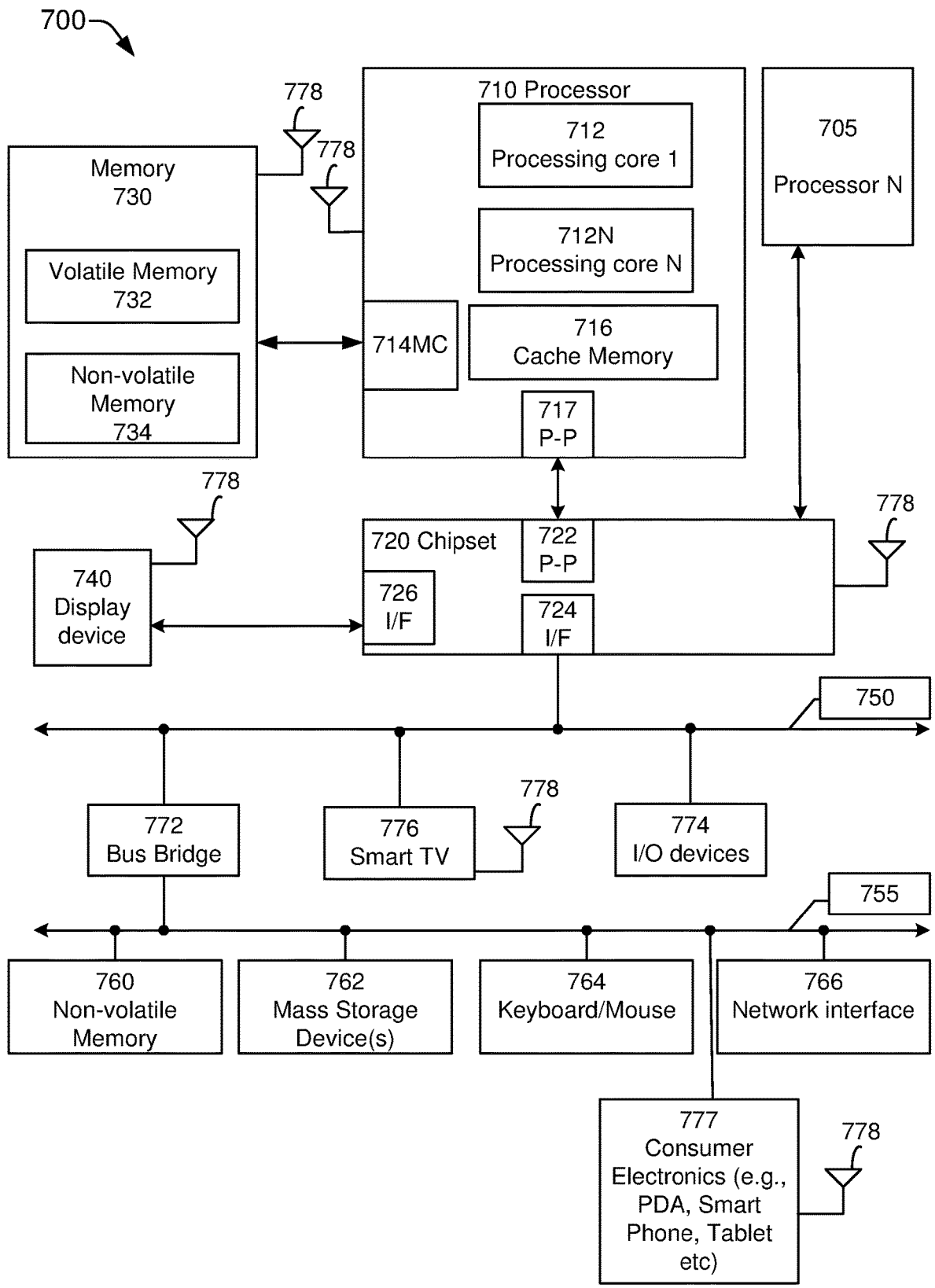
FIG. 7 depicts an example of a system according to one or more example embodiments of the disclosure.

FIG. 7 depicts an example of a system 700 according to one or more embodiments of the disclosure. In an embodiment, the transistors described herein can be used in connection with system 700. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 can include a system on a chip (SOC) system.

In one embodiment, system 700 includes multiple processors including processor 710 and processor N 705, where processor N 705 has logic similar or identical to the logic of processor 710. In one embodiment, processor 710 has one or more processing cores (represented here by processing core 1 712 and processing core N 712N, where 712N represents the Nth processor core inside processor 710, where N is a positive integer). More processing cores can be present (but not depicted in the diagram of FIG. 7). In some embodiments, processing core 712 includes, but is not limited to, pre-fetch logic to fetch instructions, decode logic to decode the instructions, execution logic to execute instructions, a combination thereof, or the like. In some embodiments, processor 710 has a cache memory 716 to cache instructions and/or data for system 700. Cache memory 716 may be organized into a hierarchical structure including one or more levels of cache memory.

In some embodiments, processor 710 includes a memory controller (MC) 714, which is configured to perform functions that enable the processor 710 to access and communicate with memory 730 that includes a volatile memory 732 and/or a non-volatile memory 734. In some embodiments, processor 710 can be coupled with memory 730 and chipset 720. Processor 710 may also be coupled to a wireless antenna 778 to communicate with any device configured to transmit and/or receive wireless signals. In one embodiment, the wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory device 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interface 717 and P-P interface 722. Chipset 720 enables processor 710 to connect to other elements in system 700. In some embodiments of the disclosure, P-P interface 717 and P-P interface 722 can operate in accordance with a PtP communication protocol, such as the Intel® QuickPath Interconnect (QPI) or the like. In other embodiments, a different interconnect may be used.

In some embodiments, chipset 720 can be configured to communicate with processor 710, the processor N 705, display device 740, and other devices 772, 776, 774, 760, 762, 764, 766, 777, etc. Chipset 720 may also be coupled to the wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the disclosure, processor 710 and chipset 720 are integrated into a single SOC. In addition, chipset 720 connects to bus 750 and/or bus 755 that interconnect various elements 774, 760, 762, 764, and 766. Bus 750 and bus 755 may be interconnected via a bus bridge 772. In one embodiment, chipset 720 couples with a non-volatile memory 760, a mass storage device(s) 762, a keyboard/mouse 764, and a network interface 766 via interface 724 and/or 704, smart TV 776, consumer electronics 777, etc.

In one embodiment, mass storage device(s) 762 can include, but not be limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 or selected elements thereof can be incorporated into processor core 712.

It is noted that the system 700 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-6), as disclosed herein, may be provided in any variety of electronic device including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 may include an integrated circuit, comprising: a substrate; a source on the substrate; a drain on the substrate; a gate dielectric on a channel between the source and the drain, the gate dielectric comprising a ferroelectric material; and a gate on the gate dielectric.

Example 2 may include the integrated circuit of example 1 and/or some other example herein, wherein the substrate comprises a p-type substrate.

Example 3 may include the integrated circuit of example 1 and/or some other example herein, wherein the ferroelectric material comprises hafnium and oxygen.

Example 4 may include the integrated circuit of example 1 and/or some other example herein, wherein the substrate comprises one or more of silicon, germanium, an alloy of silicon and germanium, or a III-V semiconductor.

Example 5 may include an inverter, comprising: a first integrated circuit comprising: a substrate having a first portion that is an n-type substrate and a second portion that is a p-type substrate; a first source on the first portion of the substrate; a first drain on a second portion of the substrate; a first gate dielectric on a first channel between the first source and the first drain; and a first gate on the first gate dielectric; a second integrated circuit comprising: the second portion of the substrate; a second source on the second portion of the substrate; a second drain on the second portion of the substrate; a second gate dielectric on a second channel between the second source and the second drain, the second gate dielectric comprising a ferroelectric material; and a second gate on the second gate dielectric; wherein the first drain and the second source comprise an output node for the inverter.

Example 6 may include the inverter of claim 5 and/or some other example herein, wherein the ferroelectric material comprises hafnium and oxygen.

Example 7 may include the inverter of claim 5 and/or some other example herein, further comprising an insulator that at least partially encapsulates the inverter.

Example 8 may include the inverter of claim 7 and/or some other example herein, wherein an etch stop is on the insulator.

Example 9 may include the inverter of claim 5 and/or some other example herein, wherein a first contact is on the first gate and a first electrical connection to the inverter is at the first contact.

Example 10 may include the inverter of claim 9 and/or some other example herein, wherein a second contact is on the second gate and a second electrical connection to the inverter is at the second contact.

Example 11 may include the inverter of claim 10 and/or some other example herein, wherein a third contact is on the output node and a third electrical connection to the inverter is at the third contact.

Example 12 may include the inverter of claim 11 and/or some other example herein, wherein the substrate comprises one or more of silicon, germanium, an alloy of silicon and germanium, or a III-V semiconductor.

Example 13 may include a memory device comprising an inverter, the inverter comprising: a first integrated circuit comprising: a substrate having a first portion that is an n-type substrate and a second portion that is a p-type substrate; a first source on the first portion of the substrate; a first drain on the second portion of the substrate; a first gate dielectric on a first channel between the first source and the first drain; and a first gate on the first gate dielectric; a second integrated circuit comprising: the second portion of the substrate; a second source on the second portion of the substrate; a second drain on the second portion of the substrate; a second gate dielectric on a second channel between the second source and the second drain, the second gate dielectric comprising a ferroelectric material; and a second gate on the second gate dielectric; wherein the first drain and the second source comprise an output node for the inverter.

Example 14 may include the memory device of example 13 and/or some other example herein, wherein the ferroelectric material comprises hafnium and oxygen.

Example 15 may include the memory device of example 13 and/or some other example herein, further comprising an insulator that at least partially encapsulates the inverter.

Example 16 may include the memory device of example 15 and/or some other example herein, wherein an etch stop is on the insulator.

Example 17 may include the memory device of example 13 and/or some other example herein, wherein a first contact is on the first gate and a first electrical connection to the inverter is at the first contact.

Example 18 may include the memory device of example 17 and/or some other example herein, wherein a second contact is on the second gate and a second electrical connection to the inverter is at the second contact.

Example 19 may include the memory device of example 18 and/or some other example herein, wherein a third contact is on the output node and a third electrical connection to the inverter is at the third contact.

Example 20 may include the memory device of example 13 and/or some other example herein, wherein the substrate comprises one or more of silicon, germanium, an alloy of silicon and germanium, or a III-V semiconductor.

Example 21, the electronic device comprising: an integrated circuit, comprising: a substrate; a source on the substrate; a drain on the substrate; a gate dielectric on a channel between the source and the drain, the gate dielectric comprising a ferroelectric material; and a gate on the gate dielectric.

Example 22 may include the electronic device of example 21 and/or some other example herein, wherein the substrate comprises a p-type substrate.

Example 23 may include the electronic device of example 21 and/or some other example herein, wherein the ferroelectric material comprises hafnium and oxygen.

Example 24 may include the electronic device of example 21 and/or some other example herein, wherein the substrate comprises one or more of silicon, germanium, an alloy of silicon and germanium, or a III-V semiconductor.

Example 25 may include an electronic device comprising: an inverter, comprising: a first integrated circuit comprising: a substrate having a first portion that is an n-type substrate and a second portion that is a p-type substrate; a first source on the first portion of the substrate; a first drain on a second portion of the substrate; a first gate dielectric on a first channel between the first source and the first drain; and a first gate on the first gate dielectric; a second integrated circuit comprising: the second portion of the substrate; a second source on the second portion of the substrate; a second drain on the second portion of the substrate; a second gate dielectric on a second channel between the second source and the second drain, the second gate dielectric comprising a ferroelectric material; and a second gate on the second gate dielectric; wherein the first drain and the second source comprise an output node for the inverter.

Example 26 may include the electronic device of example 25 and/or some other example herein, wherein the ferroelectric material comprises hafnium and oxygen.

Example 27 may include the electronic device of example 25 and/or some other example herein, further comprising an insulator that at least partially encapsulates the inverter.

Example 28 may include the electronic device of example 27 and/or some other example herein, wherein an etch stop is on the insulator.

Example 29 may include the electronic device of example 25 and/or some other example herein, wherein a first contact is on the first gate and a first electrical connection to the inverter is at the first contact.

Example 30 may include the electronic device of example 29 and/or some other example herein, wherein a second contact is on the second gate and a second electrical connection to the inverter is at the second contact.

Example 31 may include the electronic device of example 30 and/or some other example herein, wherein a third contact is on the output node and a third electrical connection to the inverter is at the third contact.

Example 32 may include the electronic device of example 31 and/or some other example herein, wherein the substrate comprises one or more of silicon, germanium, an alloy of silicon and germanium, or a III-V semiconductor.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and the performance of any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An inverter, comprising:
a first transistor structure over a substrate, the first transistor structure comprising:
a first source comprising n-type semiconductor material;
a first drain comprising n-type semiconductor material;
a first gate insulator over a first channel, between the first source and the first drain,
wherein the first gate insulator comprises a non-ferroelectric material; and
a first gate over the first gate insulator;
a second transistor structure over the substrate, the second transistor structure comprising:
a second source comprising p-type semiconductor material;
a second drain comprising p-type semiconductor material;
a second gate insulator over a second channel, between the second source and the second drain,
wherein the second gate insulator comprises a ferroelectric material; and
a second gate on the second gate insulator;
wherein an output node for the inverter comprises the first drain and the second source, and
wherein an input node for the inverter comprises the first gate and the second gate.

2. The inverter of claim 1, wherein the ferroelectric material comprises hafnium and oxygen.

3. The inverter of claim 1, further comprising an insulator that at least partially encapsulates the inverter.

4. The inverter of claim 3, wherein an etch stop is on the insulator.

5. The inverter of claim 1, wherein a first contact is on the first gate and a first electrical connection to the inverter is at the first contact.

6. The inverter of claim 5, wherein a second contact is on the second gate and a second electrical connection to the inverter is at the second contact.

7. The inverter of claim 6, wherein a third contact is on the output node and a third electrical connection to the inverter is at the third contact.

8. The inverter of claim 7, wherein each of the first channel and the second channel comprises one or more of silicon, germanium, an alloy of silicon and germanium, or a III-V semiconductor.

9. A static random access memory (SRAM) device comprising the inverter of claim 1.

10. The inverter of claim 1, wherein the second transistor has a sub-threshold slope less than 60 mV/decade of drain current.

11. The inverter of claim 10, wherein the non-ferroelectric material comprises silicon and nitrogen, or comprises oxygen and at least one of hafnium, tantalum, titanium, aluminum or silicon.

* * * * *